United States Patent
Mayer et al.

(10) Patent No.: US 6,648,205 B2
(45) Date of Patent: Nov. 18, 2003

(54) METHOD FOR THE CALIBRATION OF A WIRE BONDER

(75) Inventors: Michael Mayer, Neuheim (CH); Jürg Schwizer, Pfaffnau (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/160,974

(22) Filed: May 30, 2002

(65) Prior Publication Data

US 2003/0080176 A1 May 1, 2003

(30) Foreign Application Priority Data

Oct. 26, 2001 (CH) ..................... 2001 1975/01

(51) Int. Cl.$^7$ .............................. B23K 1/06; B23K 31/02
(52) U.S. Cl. ..................... 228/102; 228/103; 228/110.1; 228/180.5
(58) Field of Search ............................. 228/4.5, 180.5, 228/1.1, 110.1, 102, 103, 8, 9, 10, 11

(56) References Cited

U.S. PATENT DOCUMENTS

| | | | |
|---|---|---|---|
| 4,373,653 A | * 2/1983 | Salzer et al. ................. 228/104 |
| 4,887,470 A | * 12/1989 | Flyer et al. .............. 73/862.68 |
| 5,199,630 A | 4/1993 | Felber et al. |
| 5,230,458 A | * 7/1993 | Asanasavest ................. 228/102 |
| 5,321,638 A | * 6/1994 | Witney ....................... 702/104 |
| 5,357,423 A | 10/1994 | Weaver et al. |
| 5,443,200 A | * 8/1995 | Arikado ....................... 228/102 |
| 5,645,210 A | * 7/1997 | Toner et al. ................. 228/102 |
| 5,979,737 A | * 11/1999 | Farassat ....................... 228/1.1 |
| 6,070,778 A | * 6/2000 | Takahashi et al. ............ 228/4.5 |
| 6,095,396 A | * 8/2000 | Takahashi et al. ............ 228/4.5 |
| 6,206,266 B1 | * 3/2001 | Takahashi et al. ........... 228/102 |
| 6,215,195 B1 | * 4/2001 | Koduri ........................ 257/784 |
| 6,308,881 B1 | * 10/2001 | Hesse et al. ................. 228/102 |
| 6,513,696 B1 | * 2/2003 | Ho et al. ..................... 228/4.5 |
| 6,564,115 B1 | * 5/2003 | Kinnaird ..................... 700/121 |
| 2003/0080176 A1 | * 5/2003 | Mayer et al. |

FOREIGN PATENT DOCUMENTS

EP 0 953 398 A1 11/1999

OTHER PUBLICATIONS

"Analysis of Ultrasonic Wire Bonding by In–situ Piezoresistive Microsensors", Transducers '01—Eurosensors XV, p. 1426, The 11th Conference on Solid–State Sensors and Actuators, Munich, Germany, Jun. 10–14, 2001, Schiwer, Jürg, et al.

* cited by examiner

Primary Examiner—Kiley Stoner
(74) Attorney, Agent, or Firm—McCormick, Paulding & Huber LLP

(57) ABSTRACT

A Wire Bonder has a capillary clamped to a horn. An ultrasonic transducer applies ultrasonics to the horn whereby the ultrasonic transducer is controlled by a parameter P. For calibration of the parameter P, a pizoresistive sensor integrated into a semiconductor chip is used. The capillary is lowered onto the semiconductor chip and a bond force is applied to it. Afterwards, a value $P_1$ of the parameter P is applied to the ultrasonic transducer and the output signal of the sensor is stored as the reference value $U_{Ref}$ as soon as the transient reaction is concluded. The bond force is selected great enough so that the capillary does not slide back and forth. The Wire Bonder, for example after changing the capillary, is then recalibrated in that a correction factor γ is analogously determined so that the amplitude of the sensor signal assumes the value $U_{Ref}$ when the ultrasonic transducer is operated with the value $P_2 = \gamma * P_1$.

12 Claims, 3 Drawing Sheets

METHOD FOR THE CALIBRATION OF A WIRE BONDER

PRIORITY CLAIM

CROSS REFERENCE TO RELATED APPLICATION

Figure 1:
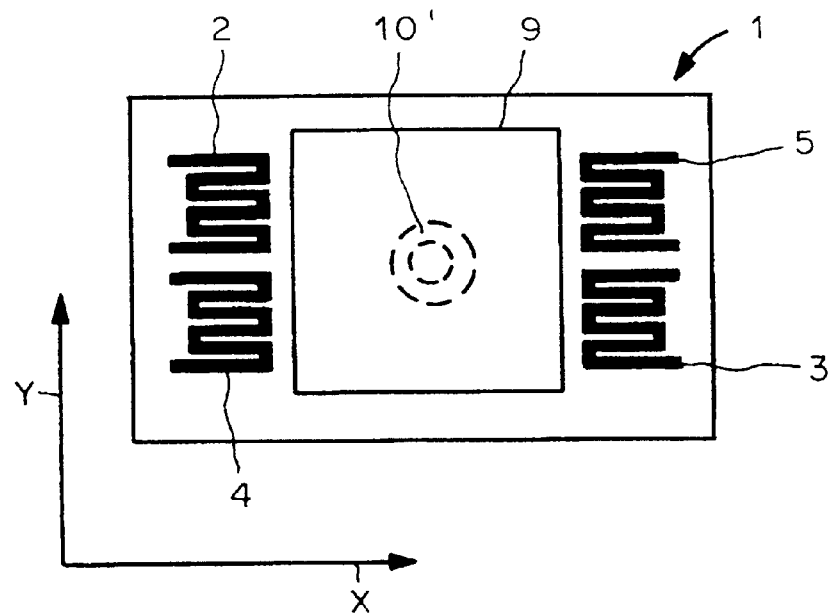

The present application under 35 U.S.C. §119 claims priority from and incorporates by reference the subject matter in Swiss Patent Application No. 2001 1975/01 filed Oct. 26, 2001.

FIELD OF THE INVENTION

The invention concerns a method for the calibration of a Wire Bonder.

BACKGROUND OF THE INVENTION

A Wire Bonder is a machine with which wire connections are made to semiconductor chips after they have been mounted on a substrate. The Wire Bonder has a capillary which is clamped to the tip of a horn. The capillary serves to secure the wire to a connection point on the semiconductor chip and to a connection point on the substrate as well as to guide the wire between the two connection points. On making the wire connection between the connection point on the semiconductor chip and the connection point on the substrate, the end of the wire protruding from the capillary is first melted into a ball. Afterwards, the wire ball is secured to the connection point on the semiconductor chip by means of pressure and ultrasonics. In doing so, ultrasonics are applied to the horn from an ultrasonic transducer. This process is known as ball bonding. The wire is then pulled through to the required length, formed into a wire loop and welded to the connection point on the substrate. This last process is known as wedge bonding. After securing the wire to the connection point on the substrate, the wire is torn off and the next bond cycle can begin.

The ball bonding can be influenced by various factors. In order to achieve bond connections of a predetermined quality, the optimum values of several physical and/or technical parameters must be determined for a particular process. Examples of such parameters are the bond force, that is the force which, during the bonding process, is exerted by the capillary on the ball or the connection point on the semiconductor chip, or the amplitude of the alternating current with which the ultrasonic transducer applies ultrasonics to the horn.

During bonding, the capillary wears out so that, from time to time, it must be replaced by a new capillary. When the capillary is exchanged, the oscillating behaviour of the tip of the capillary generally changes because each capillary has somewhat different characteristics and is also clamped differently in the horn. Therefore, after each capillary change, specific parameters of the Wire Bonder must be recalibrated, in particular, the amplitude of the alternating current which is applied to the horn by the ultrasonic transducer must be adapted to the new conditions.

A method for calibrating the oscillation amplitude of the horn is known from the U.S. Pat. No. 5,199,630. With this method, the amplitude of the tip of the horn oscillating freely in the air is measured and the amplitude of the alternating current applied to the horn by the ultrasonic transducer is redefined so that the tip of the horn oscillating freely in the air assumes a predetermined value.

A method of calibrating the parameters of a Wire Bonder with which the tip of the capillary or the bond ball guided by the tip of the capillary touches a connection point on a test chip, is known from the European patent application EP 953 398. The test chip contains a sensor integrated in the area of the connection point the signal of which is used for the calibration. A sensor measuring the temperature for example is foreseen for the calibration of the ultrasonic power.

A piezoresistive sensor which enables the registration of the mechanical stresses which occur in silicon during bonding is known from the article "Analysis of ultrasonic wire bonding by in-situ piezoresistive microsensors", which was published in the proceedings of the conference on "Transducers '01 Eurosensors XV" which took place in Munich from Jun. 10–14, 2001.

The object of the invention is to develop a method for the calibration of a Wire Bonder which guarantees that, in mass production, semiconductor chips are wire bonded under the same process conditions both before and after a capillary change.

A further object which presents itself in mass-production is the transmission of the optimum parameters found on one Wire Bonder to another Wire Bonder. The invention should also offer a solution for this object and support the transfer of recipes from Wire Bonder to Wire Bonder in a simple and robust manner.

BRIEF DESCRIPTION OF THE INVENTION

The named objects are solved in accordance with the invention by means of a method with which firstly a reference value is determined for a first Wire Bonder by means of a sensor integrated into a semiconductor chip and with which the same sensor or a sensor of the same type is used to recalibrate the first Wire Bonder for example after capillary exchange or to calibrate another Wire Bonder by means of referring to this reference value.

Every Wire Bonder has a capillary clamped to a horn. Ultrasonics is applied to the horn by an ultrasonic transducer whereby the ultrasonic transducer is controlled by means of a parameter P. For the calibration of the parameter P, a reference value $U_{Ref}$ is determined in accordance with the following steps:

a1) Placing the capillary without wire or wire ball onto a contact area of the sensor, b1) Application of a bond force $F_C$ to the capillary which is great enough so that, in the next step, the capillary does not slide back and forth on the surface of the sensor 1, c1) Application of a predetermined value $P_1$ of the parameter to the ultrasonic transducer and acquiring the value $U_1$ of the amplitude of the sensor signal after a stationary condition has been achieved, and d1) Storage of value $U_1$ of the sensor signal as reference value $U_{Ref}$.

The first Wire Bonder will then be recalibrated, for example after a capillary change, or another Wire Bonder will be calibrated in that a correction factor γ is determined in accordance with the following steps:

a2) Placing the capillary without wire or wire ball onto the contact area of the same sensor or another sensor of the same type, b2) Applying the same bond force $F_C$ to the capillary, and c2) Operating the ultrasonic transducer under the control of the parameter P, and d2) Determining the correction factor γ so that the amplitude of the sensor signal assumes the value $U_{Ref}$ when the ultrasonic transducer is operated with the value $P_2=γ*P_1$.

If, therefore, the ultrasonic transducer of the Wire Bonder calibrated in this way is operated in production with the value $P_2=\gamma*P_1$ of parameter P, it is then ensured that the semiconductor chips are wire-connected under the same physical process conditions as the semiconductor chips of the first Wire Bonder immediately after determination of the reference value $U_{Ref}$.

In accordance with a preferred embodiment, in step c2), value $P_1$ of the parameter is applied to the ultrasonic transducer and the value U of the amplitude of the sensor signal is acquired after the stationary condition has been achieved and, in step d2), the correction factor $\gamma$ is determined as $\gamma=U_{Ref}/U$.

In accordance with another embodiment, in step c2), the value of parameter P is changed until the amplitude of the sensor signal assumes the value $U_{Ref}$ whereby the value of parameter P in this condition is designated as $P_2$. The correction factor $\gamma$ is then determined as $\gamma=P_2/P_1$.

The parameter P which is calibrated in this way is, for example, the current flowing through the ultrasonic transducer or the voltage applied to the ultrasonic transducer.

In the following, embodiments of the invention are described in more detail based on the drawing.

BRIEF DESCRIPTION OF THE DRAWING FIGURES

Figure 2:
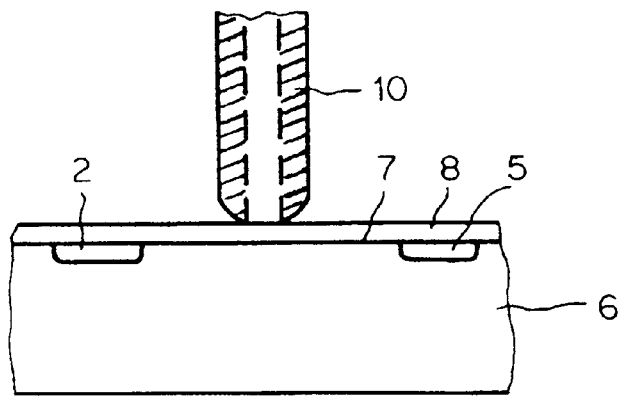
Figure 3:
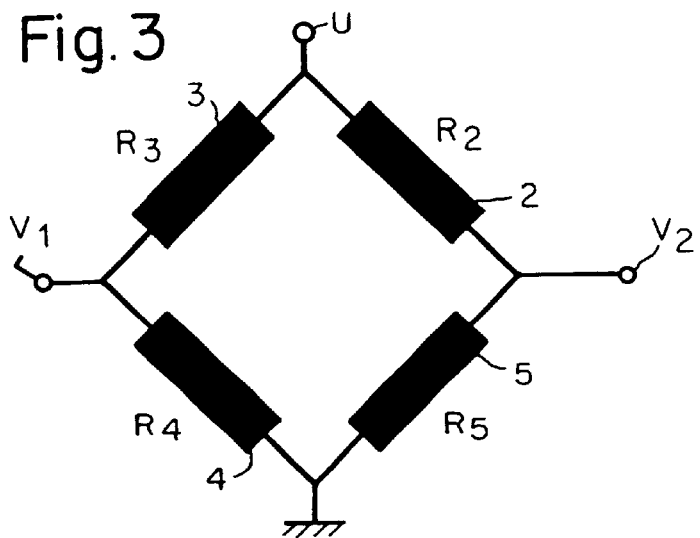
Figure 4:
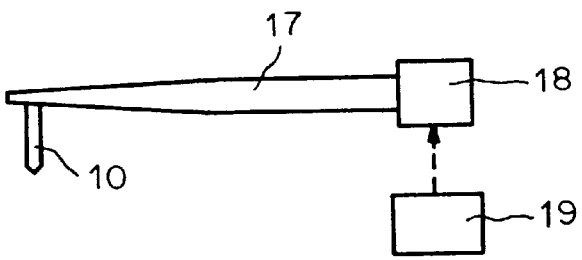
Figure 5:
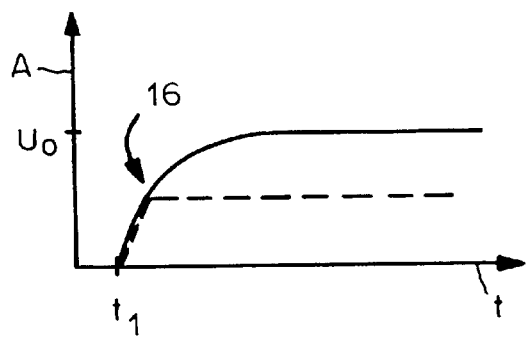
Figure 6:
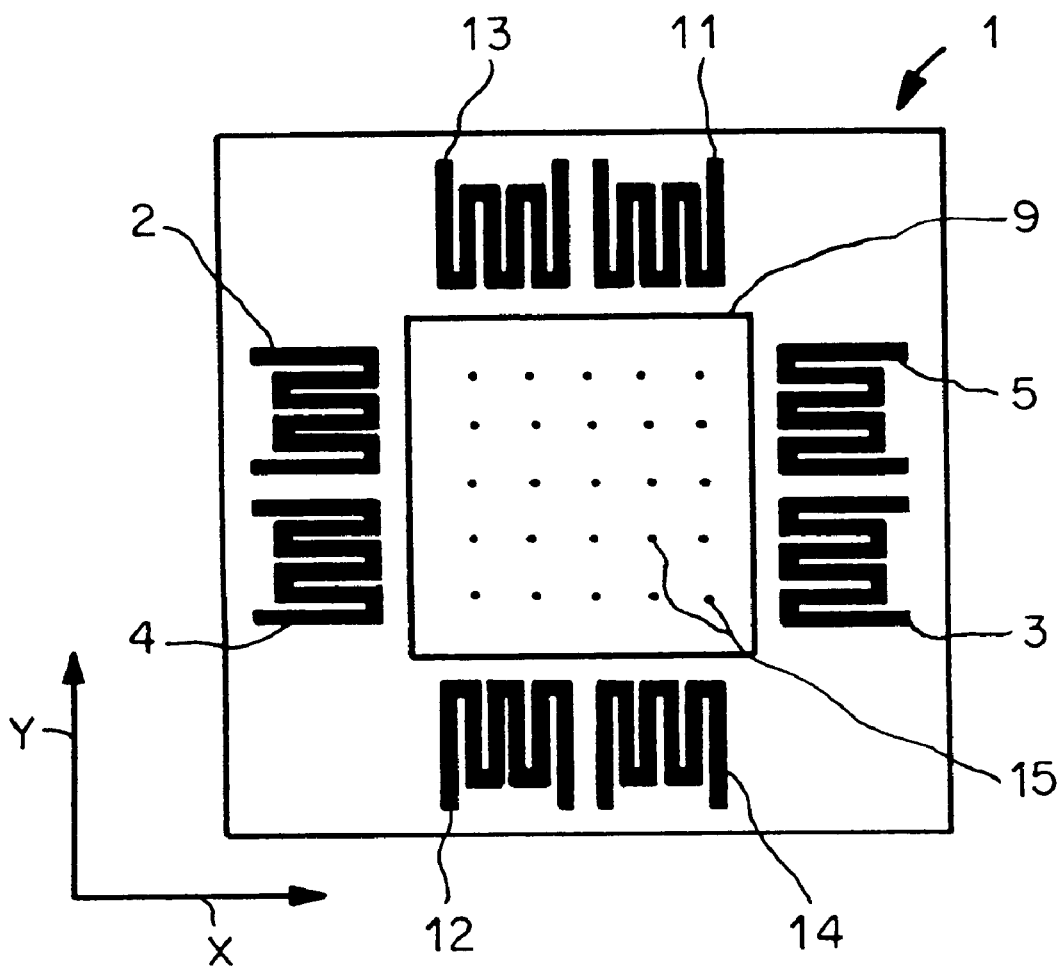

It is shown in:

FIGS. 1, 2 a sensor integrated into a semiconductor chip which comprises four piezoresistive elements, FIG. 3 the electrical circuit of the four piezoresistive elements, FIG. 4 parts of a Wire Bonder FIG. 5 the output signals of the sensor, and FIG. 6 a further sensor.

DESCRIPTION OF THE PREFERRED EMBODIMENTS

FIGS. 1 and 2 show a plan view and cross-section of a sensor 1 integrated into a semiconductor chip which comprises four piezoresistive elements 2 to 5 which are electrically connected as a Wheatstone bridge. The output signal of the sensor 1 corresponds to the output signal of the Wheatstone bridge. The sensor preferably consists of n-doped silicon 6, embedded into one surface 7 of which are the piezoresistive elements 2 to 5 as wave-form resistive paths made of p-doped silicon. The surface 7 of the sensor 1 is covered with a conventional passivation layer 8. The piezoresistive elements 2 to 5 are arranged outside of an approximately square contact area 9, within which the tip of the capillary 10 of a Wire Bonder presses onto the semiconductor chip when calibrating the ultrasonic power. The area where the tip of the capillary 10 ideally presses on the sensor 1 is presented by a broken circular ring 10'. In FIG. 1, the axes of a cartesian system of coordinates are designated x and y. The x direction preferably runs parallel to an [110] axis of the silicon crystal. The wave-form paths of the piezoresistive elements 2 to 5 run in x direction and, seen in x direction, are arranged to the left and right outside the contact area 9. They serve to detect mechanical stresses which are caused by the shear force $F_x$ which is induced in the sensor 1 in x direction on applying ultrasonics to the capillary 10. On calibration, the sensor 1 is to be orientated in relation to the Wire Bonder so that the direction of oscillation of the capillary 10 runs as parallel as possible to the x direction.

FIG. 3 shows the electrical circuit diagram of the Wheatstone bridge formed by the four piezoresistive elements 2 to 5. The four piezoresistive elements 2 to 5 are wired up via customary conductors made of aluminium. The Wheatstone bridge is preferably supplied with a voltage U from a constant voltage source. The output voltage $U_{Out}=V_1-V_2$ of the Wheatstone bridge then results in $$U_{Out} = \frac{R_2 R_4 - R_3 R_5}{(R_3 + R_4)*(R_2 + R_5)} U, \quad (1)$$

whereby $R_2$ to $R_5$ designate the ohmic resistance of the piezoresistive elements 2 to 5.

The sensor 1 is suitable for the calibration of the ultrasonic transducer of the Wire Bonder or, more precisely, a parameter P with which the ultrasonic transducer is controlled. FIG. 4 gives a schematic presentation of parts of a Wire Bonder, namely a horn 17, an ultrasonic transducer 18 formed from piezoresistive elements and an energy source 19 supplying the ultrasonic transducer 18. When wiring a semiconductor chip by means of a Wire Bonder in accordance with the procedural steps described in the introduction, various bond parameters have to be optimised for a specific product, ie, a specific combination of semiconductor chip and substrate. In the literature, even in Patent literature, countless details of ball bonding have been comprehensively described. The following simple example of a ball bonding process is used for the understanding of the invention. After forming the wire ball at the tip of the capillary, the capillary is lowered until the wire ball impacts on the contact point of the semiconductor chip and until the capillary presses the wire ball onto the contact point with a predetermined force, the so-called bond force $F_B$. Then, ultrasonics are applied to the capillary for a predefined bond time, $\tau$. Afterwards, the capillary is raised again and the wire loop is formed. The capillary is clamped to the tip of the horn 17. During bonding, ultrasonics are applied to the horn 17 by means of the ultrasonic transducer 18. In doing so, a constant alternating current or a constant alternating voltage or a constant energy is applied to the ultrasonic transducer 18 from the energy source 19. In the example, an alternating current $I=I_T*\sin(\omega t)$ is applied to the ultrasonic transducer 18, whereby $I_T$ designates the amplitude, $\omega$ the frequency and t the time. In the example therefore, the parameter P which is applied to the ultrasonic transducer 18 is the alternating current I which is supplied by the energy source 19.

Before the wiring of a new product begins, suitable parameters for the bond force $F_B$, for the amplitude $I_T$ of the alternating current and the bond time $\tau$ adapted for the new product have first to be determined. The determining of these parameters takes place with a first capillary and the optimum values found for the parameters are designated $F_{B1}$, $I_{T1}$ and $\tau$. After these parameters have been determined, a reference value $U_{Ref}$ is determined in accordance with the following steps:

1. The capillary, without wire or wire ball, is placed on the contact area 9 of the sensor 1. The capillary should be placed as close as possible to the middle of the contact area 9.
2. A bond force $F_C$ which is great enough so that in the next step 3 the capillary does not slide back and forth on the surface of the sensor 1 is applied to the capillary. A bond force of 1N has proved to be reliable.
3. A constant alternating current the amplitude of which has the value $I_{T1}$ is applied to the ultrasonic transducer. One now waits until the transient reaction is concluded and a stationary condition is achieved. This stationary condition is characterised in that the amplitude $U_0$ of the sensor signal $U_{Out}(t)$ no longer changes.

4. The amplitude $U_0$ of the sensor signal $U_{Out}(t)$ occurring in the stationary condition is saved as the reference value $U_{Ref}$: $U_{Ref}=U_0$ (2).

Afterwards, the wire is again thread into the capillary and production is started with the previously found values $F_{B1}$ for the bond force, $I_{T1}$ for the amplitude of the alternating current flowing through the ultrasonic transducer and the bond time τ.

After a capillary change or a horn change or even for a recalibration during production, a new value $I_{T2}$ is always determined for the amplitude $I_T$ of the alternating current flowing through the ultrasonic transducer. This can take place for example in that a correction factor γ is determined in accordance with the following steps:

1. Once again, the new capillary without wire or wire ball is placed onto the sensor 1 as close as possible to the middle of the contact area 9.
2. The bond force $F_C$ is applied to the capillary.
3. A constant alternating current the amplitude of which has the value $I_{T1}$ is applied to the ultrasonic transducer. One now waits until the transient reaction is concluded and a stationary condition is achieved. The amplitude of the sensor signal $U_{Out}(t)$ occurring in the stationary condition is obtained as the value U.
4. The correction factor γ is determined as $γ=U_{Ref}/U$.

Afterwards, production can be restarted whereby a constant alternating current, the amplitude of which is given by $I_{T2}=γ*I_{T1}$, is applied to the ultrasonic transducer.

The same method is also suitable for the parameter transfer from the reference Wire Bonder to another Wire Bonder. The parameters $U_{Ref}$ and $I_{T1}$ of the reference Wire Bonder are stored on the other Wire Bonder as reference values as well as other process parameters such as the bond force. Afterwards, the correction factor γ is determined by means of a calibration in accordance with the steps described above. Production can now take place whereby a constant alternating current is applied to the ultrasonic transducer, the amplitude of which is given by $I_{T2}=γ*I_{T1}$.

The decisive factor of the method in accordance with the invention is that the capillary 10 does not slide back and forth on the sensor 1 during calibration. Nevertheless, on the application of ultrasonics, the capillary 10 exerts a shear force on the sensor 1 which is converted into an electrical signal by the piezoresistive elements 2 to 5. FIG. 5 shows the amplitude A (absolute value of the envelope) of the oscillating output signal $U_{Out}(t)$ of the Wheatstone bridge as a function of time t with an extended line in the event that the capillary 10 does not slide and with a broken line in the event that the capillary 10 suddenly begins to slide. Ultrasonics are applied to the ultrasonic transducer at time $t_1$. The capillary starts to oscillate and the oscillation amplitude continuously increases. If the capillary does not slide, then the amplitude A increases continuously during the transient reaction until the transient reaction is concluded. Now, the amplitude A has the constant value $U_0$. If, on the other hand, the bond force is too low in relation to the ultrasonic amplitude, then the capillary 10 suddenly starts to slide: The shear force $F_x$ induced in the sensor 1 no longer increases. The curve of amplitude A has a kink 16 while the amplitude A (broken line) remains at a constant level before the transient reaction is concluded.

The value $U_0$ of the output signal $U_{Out}$ of the Wheatstone bridge determined in this way is very linear in relation to the amplitude $I_T$ of the alternating current which is applied to the ultrasonic transducer. The temperature-dependency is also very low and it suffices when the temperature is constantly kept at around ±5° C. during the various calibration procedures. Furthermore, the calibration can take place at the temperature at which bonding takes place in production. This has the advantage that, on changing a capillary, no valuable time is lost because the Wire Bonder does not have to be cooled down and then warmed up again to the process temperature.

In addition, because the differences from sensor to sensor are sufficiently small, it is not necessary to always use the same sensor. This allows recipe transfer even when a sensor is permanently installed on each Wire Bonder.

It must be mentioned here that, for the recalibration of the parameter P, in the example therefore the amplitude of the alternating current flowing through the ultrasonic transducer, a slightly modified procedure can also be used with which the amplitude $I_{T2}$ of the alternating current flowing through the ultrasonic transducer is redefined directly. In doing so, the steps a2 and b2 of the previous method are performed first. Afterwards, in step c2, a constant alternating current is applied to the ultrasonic transducer the amplitude of which has the value $I_{T1}$. One now waits until the transient reaction is concluded and a stationary condition is achieved. Now, in step d2, the amplitude $I_{T1}$ is changed until the amplitude of the sensor signal $U_{Out}(t)$ has the value $U_{Ref}$. The corresponding value of the amplitude $I_{T2}$ is stored. The correction factor γ then results in $γ=I_{T2}/I_{T1}$.

Afterwards, production can be restarted whereby a constant alternating current is applied to the ultrasonic transducer the amplitude of which is given by the newly determined value $I_{T2}$, whereby $I_{T2}=γ*I_{T1}$.

FIG. 6 shows a plan view of a sensor 1 which contains the four piezoresistive elements 2 to 5 for measuring the shear force $F_x$ induced in x direction and which contains four further piezoresistive elements 11 to 14 for measuring the shear force $F_y$ induced in y direction. The four piezoresistive elements 2 to 5 are electrically connected into a first Wheatstone bridge the output signal of which is designated as $U_{Out,x}(t)$. The four piezoresistive elements 11 to 14 are electrically connected into a second Wheatstone bridge the output signal of which is designated as $U_{Out,y}(t)$. With this sensor 1, a reference value $U_{Ref}$ can be determined without the oscillation direction of the capillary 10 having to be aligned parallel to the x direction of the sensor 1. As soon as the transient reaction is concluded and a stationary condition has been achieved, the reference value $U_{Ref}$ is determined from the amplitudes $U_{0,x}$ and $U_{0,y}$ of the output signals $U_{Out,x}(t)$ and $U_{Out,y}(t)$ as $$U_{Ref} = \sqrt{U_{0,x}^2 + U_{0,y}^2}. \qquad (3)$$

The dimensions of the contact area 9 amount typically to 80 μm*80 μm, while the diameter of the tip of the capillary 10 amounts to around 20 μm to 30 μm.

The amplitudes of the output signals $U_{Out,x}$ and $U_{Out,y}$ are dependent on the position where the capillary 10 presses onto the contact area 9. To increase the accuracy of the calibration it is therefore suggested to place the capillary 10 at various locations on the contact area 9 and to determine the reference value $U_{Ref}$ and the correction factor γ based on the measured values obtained at these locations, for example as follows:

In FIG. 6 the middle touchdown points 15 of the capillary 10 are shown schematically to each of which a pair of coordinates $(x_{i,k}, y_{i,k})$ is assigned whereby the indices i and k in the example each assume five different values. The distance between two touchdown points 15 amounts typically to between 5 μm and 10 μm. The amplitudes $U_{0,x}(x_{i,k}, y_{i,k})$ and, if necessary, $U_{0,y}(x_{i,k}, y_{i,k})$, measured in accordance with one of the previously described methods, each form an area with a saddle. Now, the coordinates of the saddle $(x_{S,x}, y_{S,x})$ of the function $U_{0,x}$ and then the value $U_{0,x}(x_{S,x}, y_{S,x})$ as well as, if necessary, the coordinates of the saddle $(x_{S,y}, y_{S,y})$ of the function $U_{0,y}$ and then the value $U_{0,y}(x_{S,y}, y_{S,y})$ are determined mathematically and finally the reference value $U_{Ref}$ is calculated according to the formula (2) or (3), respectively.

In the event that the ultrasonic transducer is supplied with a constant alternating voltage and not with a constant alternating current, then the calibration takes place analogously whereby currents are replaced by voltages.

We claim:

1. A method for the calibration of one or several Wire Bonders by means of a sensor integrated into a semiconductor chip, whereby each Wire Bonder has a capillary clamped onto a horn, whereby ultrasonics are applied to the horn by an ultrasonic transducer, whereby the ultrasonic transducer is controlled by means of a parameter P and whereby a reference value $U_{Ref}$ is determined by means of a first Wire Bonder in accordance with the following steps:

a1) Placing the capillary without wire or wire ball onto a contact area of the sensor, b1) Applying a bond force to the capillary which is great enough so that, in the next step, the capillary does not slide back and forth on the contact area of the sensor, c1) Applying a predetermined value $P_1$ of the parameter to the ultrasonic transducer and obtaining the value $U_1$ of the amplitude of the sensor signal once a stationary condition has set in, and d1) Storing the value $U_1$ of the sensor signal as reference value $U_{Ref}$, and whereby the parameter P of the first Wire Bonder is recalibrated or the parameter P of another Wire Bonder is calibrated in order to operate its ultrasonic transducer in production with a value $P_2=\gamma*P_1$ of the parameter P, whereby $\gamma$ is a correction factor which is determined in accordance with the following steps:

a2) Placing the capillary without wire or wire ball onto the contact area of the same sensor or a different sensor of the same type, b2) Applying the same bond force to the capillary, and c2) Operating the ultrasonic transducer under the control of the parameter P, and d2) Determining the correction factor $\gamma$ so that the amplitude of the sensor signal assumes the value $U_{Ref}$ when the value $P_2=\gamma*P_1$ is applied to the ultrasonic transducer.

2. The method according to claim 1, wherein in step c2), the value $P_1$ of the parameter is applied to the ultrasonic transducer and the value U of the amplitude of the sensor signal is obtained once a stationary condition has set in and that in step d2) the correction factor $\gamma$ is determined as $\gamma=U_{Ref}/U$.

3. The method according to claim 1, wherein in step c2), the value of the parameter P is changed until the amplitude of the sensor signal assumes the value $U_{Ref}$ and that the correction factor $\gamma$ is determined as $\gamma=P_2/P_1$.

4. The method according to claim 1, wherein the parameter P is the alternating current which flows through the ultrasonic transducer or the alternating voltage applied to the ultrasonic transducer.

5. The method according to claim 2, wherein the parameter P is the alternating current which flows through the ultrasonic transducer or the alternating voltage applied to the ultrasonic transducer.

6. The method according to claim 3, wherein the parameter P is the alternating current which flows through the ultrasonic transducer or the alternating voltage applied to the ultrasonic transducer.

7. The method according to claim 1, wherein the sensor contains piezoresistive elements.

8. The method according to claim 2, wherein the sensor contains piezoresistive elements.

9. The method according to claim 3, wherein the sensor contains piezoresistive elements.

10. The method according to claim 4, wherein the sensor contains piezoresistive elements.

11. The method according to claim 5, wherein the sensor contains piezoresistive elements.

12. The method according to claim 7, wherein the sensor contains first piezoresistive elements for measuring the shear force induced in a first direction and second piezoresistive elements for measuring the shear force induced in a second direction and that the signals delivered by the first piezoresistive elements and the second piezoresistive elements are used for determining the reference value $U_{Ref}$ and the correction factor $\gamma$.

* * * * *